United States Patent [19]

Sawada et al.

[11] Patent Number: 5,270,589
[45] Date of Patent: Dec. 14, 1993

[54] INPUT/OUTPUT BUFFER CIRCUIT FOR SEMICONDUCTOR INTEGRATED CIRCUIT

[75] Inventors: Kazuhiro Sawada, Sunnyvale; Shigeru Tanaka, Mountain View, both of

[73] Assignee: Kabushiki Kaisha Toshiba, Kaswasaki, Japan

[21] Appl. No.: 821,368

[22] Filed: Jan. 16, 1992

[30] Foreign Application Priority Data

Jan. 17, 1991 [JP] Japan .................. 3-003827

[51] Int. Cl.$^5$ .................. H03K 19/092; H03K 19/01
[52] U.S. Cl. .................. 307/475; 307/443; 307/296.8; 307/482
[58] Field of Search .............. 307/475, 443, 451, 482, 307/243, 296.1, 296.8; 365/189.06, 189.03

[56] References Cited

U.S. PATENT DOCUMENTS

| | | | |
|---|---|---|---|
| 3,983,543 | 9/1976 | Cordaro | 307/475 |
| 4,306,163 | 12/1981 | Blume, Jr. et al. | 307/475 |
| 4,313,064 | 1/1982 | Claude | 307/475 |
| 4,479,067 | 10/1984 | Fujita | 307/475 |
| 4,703,198 | 10/1987 | Porter et al. | 307/475 |
| 4,835,684 | 5/1989 | Kanai | 365/189.03 |
| 5,177,573 | 1/1993 | Ukita et al. | 307/475 |

*Primary Examiner*—Edward P. Westin
*Assistant Examiner*—Richard Roseen
*Attorney, Agent, or Firm*—Finnegan, Henderson, Farabow, Garrett & Dunner

[57] ABSTRACT

This invention provides an input/output buffer circuit which allows input/output interfacing with another device designed to output a signal having a voltage level higher than that of the supply voltage of the semiconductor integrated circuit, and prevents the formation of an input leakage current path. An NMOS transistor is inserted between the input/output pad of the semiconductor integrated circuit and the output node of an output buffer circuit. The input node of an input buffer circuit is directly connected to the output node of the output buffer circuit or is connected to the input/output pad through another) NMOS transistor. If a transistor having a low threshold value is used as this NMOS transistor, a potential having the same level as that of the supply potential is applied to its gate. If a transistor is used, a potential having a level higher than the supply potential is applied to its gate.

22 Claims, 8 Drawing Sheets

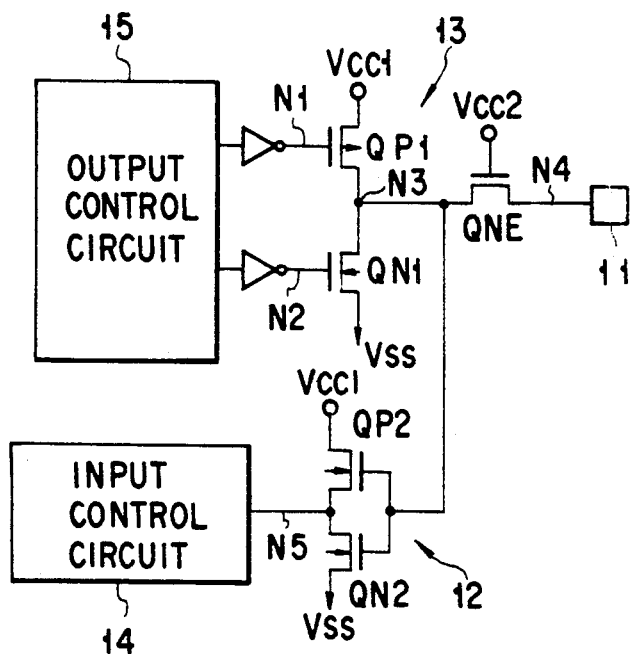
F I G. 6
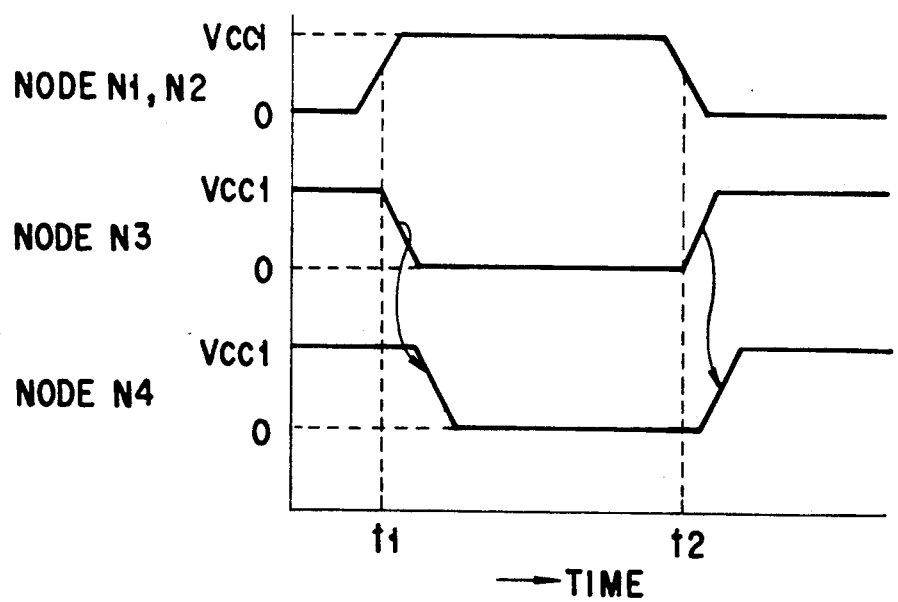
F I G. 7

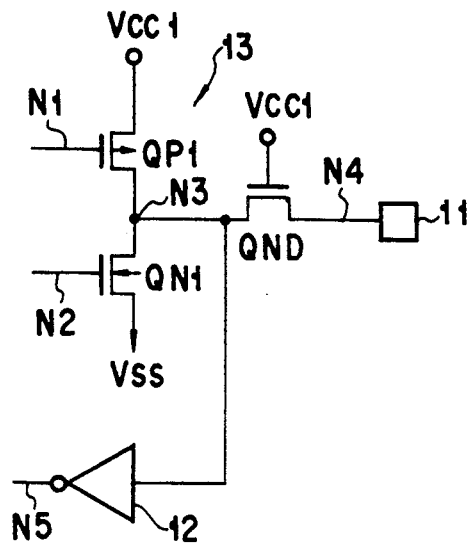
F I G. 10
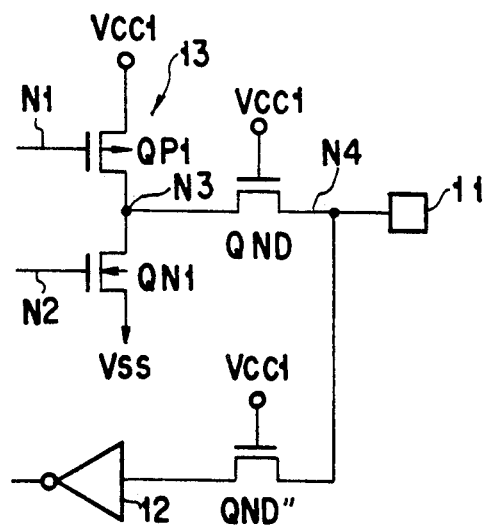
F I G. 11

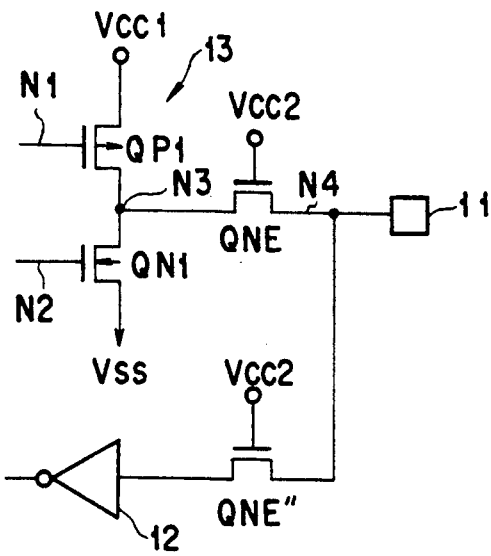
F I G. 12
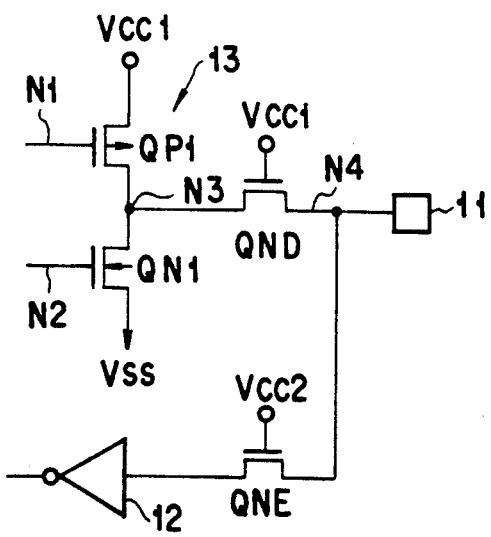
F I G. 13

INPUT/OUTPUT BUFFER CIRCUIT FOR SEMICONDUCTOR INTEGRATED CIRCUIT

BACKGROUND OF THE INVENTION

1. Field of the Invention

The present invention relates to an input/output buffer circuit in a semiconductor integrated circuit and, more particularly, to an input/output buffer circuit which allows input/output interfacing with a device designed to be operated on a different supply voltage.

2. Description of the Related Art

FIG. 1 shows an input/output buffer circuit using, e.g., a CMOS FET (complementary metal oxide semiconductor field-effect transistor), which is arranged in a conventional semiconductor integrated circuit. Referring to FIG. 1, reference numeral 11 denotes an input-/output pad; and 12 and 13, input and output buffer circuits which commonly use the input/output pad 11. The output buffer circuit 13 has a p-channel MOS transistor (PMOS transistor) QP1 and an n-channel MOS transistor (NMOS transistor) QN1 which are connected in series between a supply potential (Vcc) node and a ground potential (Vss) node. The output buffer circuit 13 outputs an output signal Dout from a circuit in the integrated circuit to the input/output pad 11 when an output enable signal EN is activated. In the input buffer circuit 12, a CMOS inverter constituted by a PMOS transistor QP2 and an NMOS transistor QN2 is used as an input stage. The input buffer circuit 12 inputs a signal, received from the outside of the integrated circuit, through the input/output pad 11, as an internal input signal Din, to a circuit in the integrated circuit.

When the above-described input and output buffer circuits are to be used as an output buffer, if the output enable signal EN is set at "H" level, a signal of "H"/"L" level is output to the input/output pad 11 in accordance with the "H"/"L" level of the output signal Dout. When the input and output buffer circuits are to be used as an input buffer, if the output enable signal EN is set at "L" level, a gate node N1 of the PMOS transistor QP1 and a gate node N2 of the MNOS transistor QN1 are accordingly set at "H"/"L" level. An input-/output node N3 is set in a high impedance state, and a signal is input from the input/output pad 11 to the input stage inverter through the input/output node N3. Finally, the internal input signal Din is input to a circuit in the integrated circuit.

FIG. 2 shows the sectional structures of the PMOS transistor QP1 and the NMOS transistor QN1 in FIG. 1. Referring to FIG. 2, reference numeral 21 denotes a p-type semiconductor substrate; 22, an n-type well; 23, a p-type impurity region formed in the n-type well 22 and serving as the source/drain of the PMOS transistor QP1; 24, an n-type impurity region for electrode extraction formed in the n-type well 22; 25, a p-type well; 26, an n-type impurity region formed in the p-type well 25 and serving as the source/drain of the NMOS transistor QN1; 27, a p-type impurity region for electrode extraction formed in the p-type well; 29, a gate electrode for the PMOS transistor QP1; 30, a source line for the PMOS transistor QP1; 31, a gate electrode for the NMOS transistor QN1; 32, a source line for the NMOS transistor QN1; and 33, a drain line for the PMOS transistor QP1 and the NMOS transistor QN1.

With advances in micropatterning of elements, the supply voltage of a device itself must be decreased in terms of reliability. The supply voltage is increasingly shifted from 5 V to 3.3 V. Especially in recent microprocessors and the like, it is expected that the supply voltage will be shifted to 3.3 V. Even if the supply voltage of a given integrated circuit is set to be 3.3 V, other devices (peripheral logic circuits and memories) with which the integrated circuit interfaces may be operated at 5 V. In this case, 5 V is applied, as an input potential, to the input/output node N3 in the above-described input/output buffer circuit arranged in the integrated circuit. In such a case, since the potential of the n-type well 22 is 3.3 V, the pn junction (at portion A in FIG. 2,) between the p-type impurity region 23 to which the input potential of 5 V is applied, and the n-type well 22, is forward-biased. As a result, interfacing cannot be performed. In addition, the input voltage of 5 V is applied to the gates of the PMOS and NMOS transistors QP2 and QN2 of the input-stage inverter, posing problems in terms of reliability.

In order to solve the problem due to the phenomenon that the pn junction between the p-type impurity region and the n-type well is forward-biased in a signal input mode, as described above, an input/output buffer circuit shown in FIG. 3 is disclosed in Randy Allmon et al., "System, Process, and Design Implication of a Reduced Supply voltage Microprocessor", ISSCC 90, pp. 48. FIG. 3 shows only circuits associated with the solution to the above-described problem, with various control circuits omitted. Note that 3.3 V and 5 V are respectively used as first and second supply potentials Vcc1 and Vcc2.

Referring to FIG. 3, a substrate (n-type well) in which an output PMOS transistor QP3 having a large channel width is formed is connected to the potential Vcc2 (=5 V). In order to transfer the potential of an input/output node N4 to a gate node N3 of the PMOS transistor QP3 and finally raise the potential to the potential Vcc2 (=5 V) in a signal input mode, a PMOS transistor QP2, having a gate connected to the potential Vcc1 (=3.3 V), is inserted between the nodes N3 and N4. In addition, in order to transfer the potential Vcc1 (=3.3 V) of the drain node N2 of a PMOS transistor QP1 to the gate node N3 and reliably turn off the output PMOS transistor QP3 when the PMOS transistor QP1 is turned on in the signal output mode, an NMOS transistor QN2 having a gate connected to the potential Vcc2 (=5 V) is inserted between the nodes N2 and N3.

FIG. 4 shows the sectional structure of the PMOS transistor QP3 in FIG. 3. Referring to FIG. 4, reference numeral 21 denotes a p-type semiconductor substrate; 22, an n-type well; 23, a p-type impurity region formed in the n-type well 22 and serving as a source/drain region; 24, a n-type impurity region for electrode extraction formed in the n-type well 22; 28, a gate insulating film on the substrate surface.

According to the circuit shown in FIG. 3, the output PMOS transistor QP3 is connected to the potential Vcc2 (=5 V). Even if a 5-V signal is input to the input-/output node N4, the pn junction (a portion B in FIG. 4) between the p-type impurity region 23 and the n-type well 22 is not forward-biased. Therefore, input/output interfacing with other devices can be performed. FIG. 5 shows the waveforms of voltages at the nodes N2, N3, and N4 in a signal input state. More specifically, input of a 5-V signal to the input/output node N4 is started at time t1, and the potential of the node N4 exceeds the potential Vcc1 (=3.3 V) at time t2. When the potential exceeds a potential of Vcc1+Vtp (the threshold voltage of the PMOS transistor QP2) at time t3, the potential of the gate node N3 of the PMOS transistor QP3 rises with an increase in potential of the node N4 and finally reaches the potential Vcc2 (=5 V). As a result, the output PMOS transistor QP3 is completely turned OFF, thus preventing a large input leakage current from flowing from the node N4 to the first supply potential Vcc1 through the PMOS transistor QP3.

The following problems are posed with respect to the transistors QP1, QN1, and QN2 arranged in a circuit portion I, shown in FIG. 3. The NMOS transistor QN2 serves to transfer the potential of the node N3 to the node N2 in a signal input mode. Similar to the output PMOS transistor QP3, the PMOS transistor QP1 is designed such that the potential Vcc2 (=5 V) is connected to the substrate (n-type well) to prevent forward bias in the signal input mode. However, as shown in the timing chart in FIG. 5, since the potential of the node N2 may become Vcc1±α depending on the transistor characteristics (e.g., a back bias effect) of the NMOS transistor QN2, the PMOS transistor QP1 is kept ON during the signal input period. For this reason, an input leakage due to an ON current is present. Although it is expected that this input leakage current is about 1 to 2 mA, in an integrated circuit such as a microprocessor having 100 or more input/output pads, the input leakage current will exceed 100 mA, posing a serious problem.

Furthermore, in the circuit shown in FIG. 3, since an input potential of a 5-V level is applied to the output NMOS transistor QN3, the transistors QP1, QN1, and QN2 in the circuit portion I, and the input-stage inverter (not shown) of the input buffer circuit, a problem is also posed in terms of reliability.

As described above, when the conventional input/output buffer circuit is to be connected to another device, if the other device is designed to output a signal having a voltage level (e.g., 5 V) higher than the supply voltage (e.g., 3.3 V) of the integrated circuit incorporating this input/output buffer circuit, connection to the other device cannot be allowed, i.e., input/output interfacing with the other device cannot be performed, or an input leakage current path is undesirably formed.

It is an object of the present invention to provide an input/output buffer circuit which allows input/output interfacing with another device designed to output a signal having a voltage level higher than the supply voltage of an integrated circuit incorporating the input/output buffer circuit.

SUMMARY OF THE INVENTION

According to the present invention, in an input/output buffer circuit having input and output buffer circuits which commonly use an input/output pad arranged in a semiconductor integrated circuit, a second NMOS transistor is connected between the input/output pad and the output node of the output buffer circuit, and the input node of the input buffer circuit is directly connected to the output node of the output buffer circuit or is connected to the input/output pad through a third NMOS transistor. If a depletion type transistor is used as the NMOS transistor, a potential having the same level as that of the supply potential of the integrated circuit is applied to its gate. If an enhancement type transistor is used as the NMOS transistor, a potential having a higher level than the supply potential is applied to its gate.

Since the second NMOS transistor (or the second and third NMOS transistors) is always ON, input/output operations are normally performed by the input and output buffer circuits. In addition, the input/output pad is connected to one end (an n-type diffusion region in a p-type well) of the second NMOS transistor (or each of the second and third NMOS transistors). Therefore, even if a signal having a level higher than the supply potential of the integrated circuit is input the input/output pad in a signal input operation, no high-level signal is applied to the drain (a p-type impurity region in an n-type well) of an output PMOS transistor of the output buffer circuit. Therefore, the pn junction between this p-type impurity region and the n-type well is not forward-biased. This facilitates input/output interfacing with another device and prevents an input leakage current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a circuit diagram showing an input/output buffer circuit according to the first embodiment of the present invention;

FIG. 7 is a timing chart showing an operation of the input/output buffer circuit in FIG. 6 in a signal output mode;

FIG. 10 is a circuit diagram showing an input/output buffer circuit according to the third embodiment of the present invention;

FIG. 11 is a circuit diagram showing an input/output buffer circuit according to the fourth embodiment of the present invention;

FIG. 12 is a circuit diagram showing an input/output buffer circuit according to a modification of the fourth embodiment of the present invention;

FIG. 13 is a circuit diagram showing an input/output buffer circuit according to another modification of the fourth embodiment of the present invention;

DETAILED DESCRIPTION OF THE PREFERRED EMBODIMENTS

Figure 1:
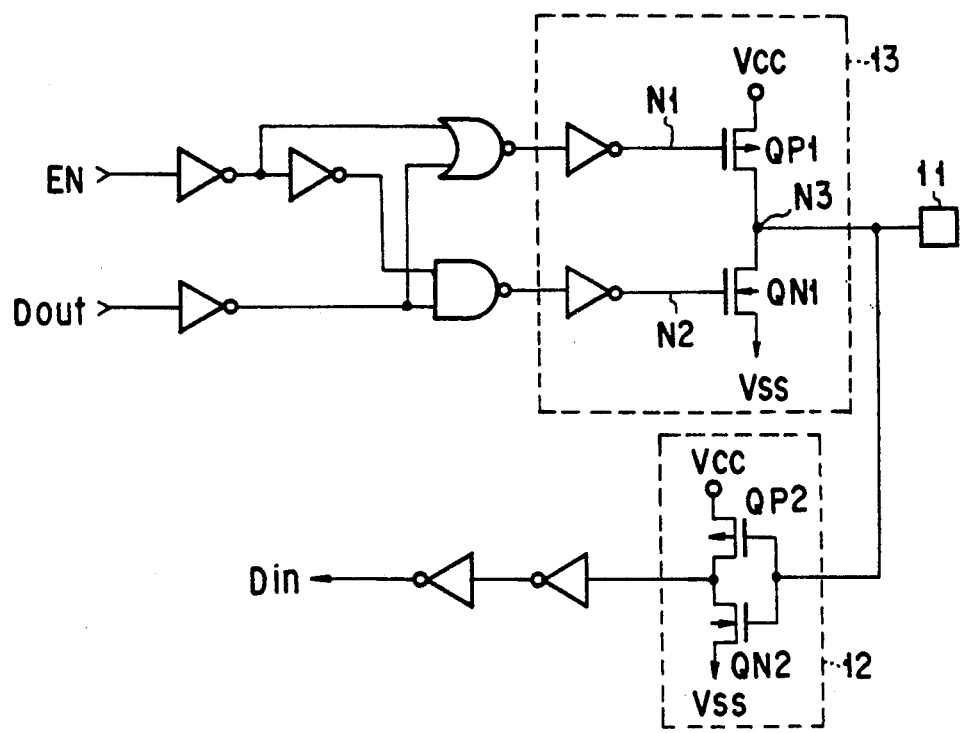
FIG. 1 is a circuit diagram showing a conventional input/output buffer circuit.
Figure 2:
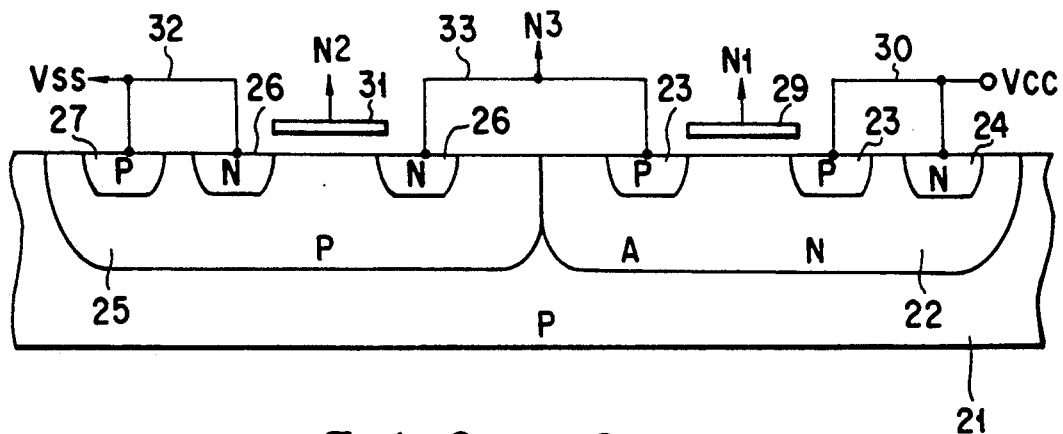
FIG. 2 is a sectional view showing the sectional structures of a PMOS transistor QP1 and an NMOS transistor QN1 shown in FIG. 1.
Figure 3:
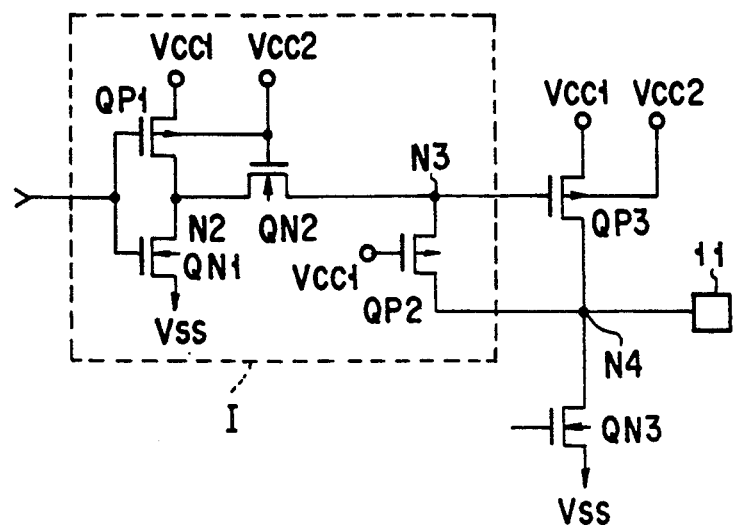
FIG. 3 is a circuit diagram showing another conventional input/output buffer circuit.
Figure 4:
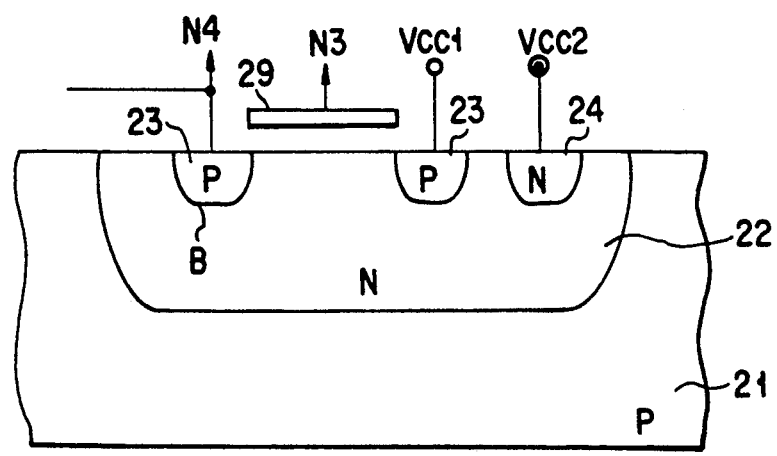
FIG. 4 is a sectional view showing; the sectional structure of a PMOS transistor QP3 shown in FIG. 3.
Figure 5:
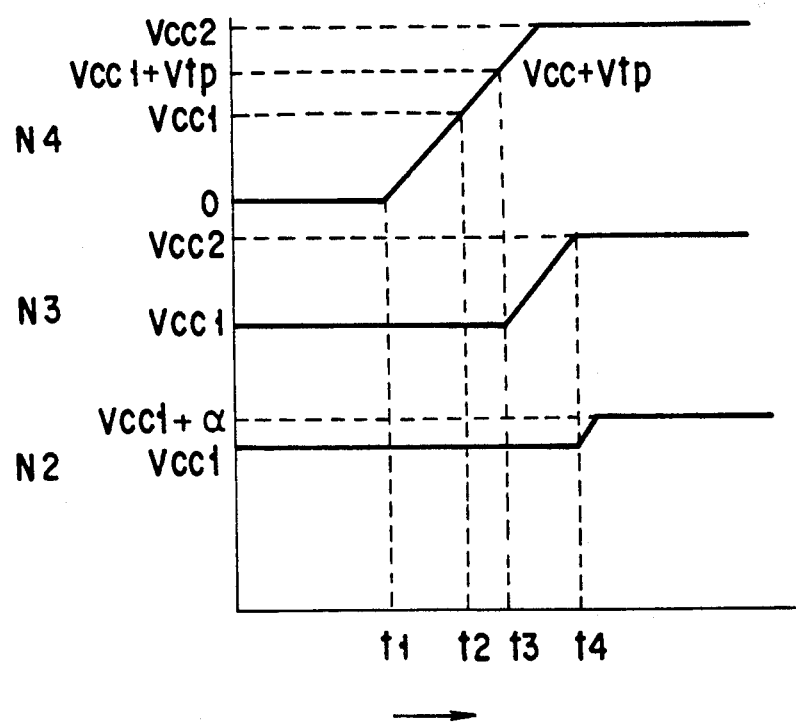
FIG. 5 is a timing chart showing an operation of the input/output buffer circuit in FIG. 3 in a signal input mode.

Embodiments of the present invention will be described below with reference to the accompanying drawings.

FIG. 6 shows an input/output buffer circuit according to the first embodiment of the present invention. As an operating voltage, a supply voltage Vcc1 of, e.g., 3.3 V is provided for an integrated circuit including the input/output buffer circuit shown in FIG. 6. Referring to FIG. 6, reference numeral 11 denotes an input/output pad; 12 and 13, input and output buffer circuits respectively which commonly use the input/output pad 11; 14, an input control circuit; and 15, an output control circuit. The output buffer circuit 13 has a PMOS transistor QP1 and a NMOS transistor QN1 connected in series between a supply potential Vcc1 node and a ground potential Vss node. The output buffer circuit 13 outputs a signal, input from the output control circuit 15 in the integrated circuit, to an output node N3 (the drain series connection point between the PMOS transistor QP1 and the NMOS transistor QN1), and further outputs it to the input/output pad 11. In the input buffer circuit 12, a CMOS inverter constituted by a PMOS transistor QP2 and an NMOS transistor QN2 is used as an input stage, and an input node is connected to the output node N3 of the output buffer circuit 13. The input buffer circuit 12 serves to output a signal, input from the integrated circuit through the input/output pad 11, to the input control circuit 14 in the integrated circuit.

In addition, an NMOS transistor QNE of an enhancement type is connected between a node N4 connected to the input/output pad 11 and the output node N3 of the output buffer circuit 13. The gate of the NMOS transistor QNE receives a second supply potential Vcc2 having a level higher than that of the supply potential Vcc1. In this case, the driving capacity of the NMOS transistor QNE is at least equal to that of each of the transistors QP1 and QN1 of the output buffer circuit 13.

Figure 8:
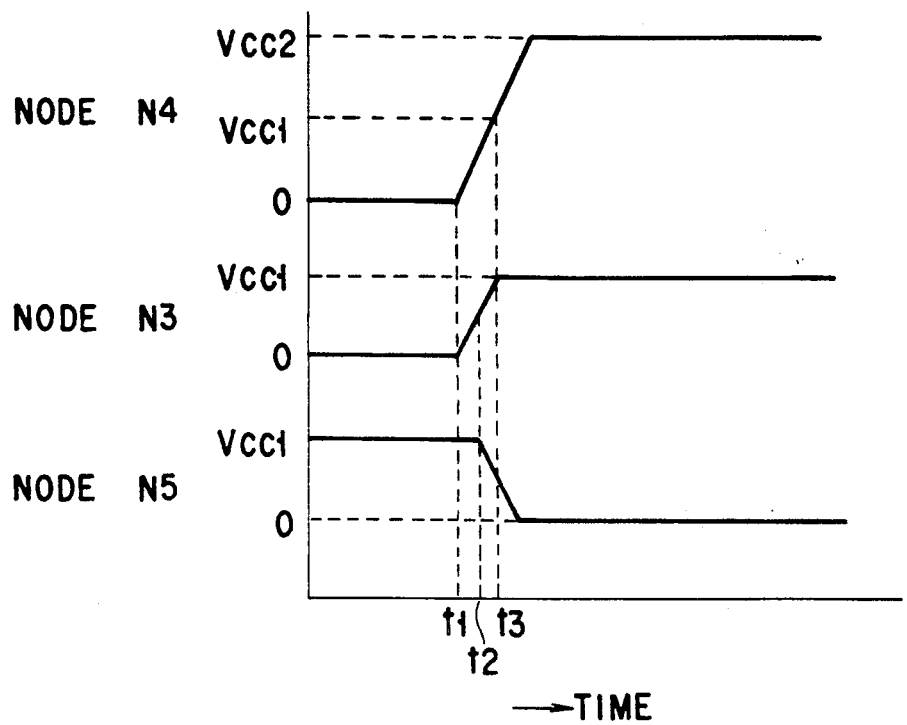
FIG. 8 is a timing chart showing an operation of the input/output buffer circuit in the signal input mode.

An operation of the input/output buffer circuit shown in FIG. 6 will be described below with reference to FIGS. 7 and 8. FIG. 7 schematically shows the waveforms of voltages at the nodes N1, N2, and N3 and N4 in a case where the input/output buffer circuit shown in FIG. 6 is used as an output buffer. FIG. 8 schematically shows the waveforms of voltages at the nodes N3, N4, and N5 in a case where the input/output buffer circuit shown in FIG. 6 is used as an input buffer. Since the NMOS transistor QNE is in an ON state all the time, input/output operations of signals are normally performed by the input and output buffer circuits 12 and 13.

In a signal output operation, shown in FIG. 7, when the potentials of the nodes N1 and N2 change from "L" level to "H" level at time t1, the node N3 is discharged through the transistor QN1 to be changed to "L" level. At this time, the potential of the node N4 is set at "L" level of the potential Vss through the transistor QNE. When the potentials of the nodes N1 and N2 change from "H" level to "L" level at time t2, charging of the node N3 through the transistor QP1 is started. Since the transistor QNE is ON, the potential of the node N4 rises upon charging of the node N3, and "H" level of the potential Vcc1 is output.

Although the AC (alternating current) characteristics and DC (direct current) characteristics of the NMOS transistor QNE may deteriorate when "H" level is output, such deterioration can be prevented by properly setting the threshold voltage of the transistor. For example, if the threshold voltage of the transistor QNE is set to be 0.3 V when the voltage of the source (node N3) of the transistor QNE becomes 3.3 V, i.e., −3.3 V is applied to the back gate, no problems are posed in terms of the AC and DC characteristics as TTL (transistor-transistor logic) level outputs.

In a signal input operation, shown in FIG. 8, when the potential of the node N4 starts to change from "L" level to "H" level at time t1, and the potential of the node N3 exceeds the threshold value of the input gate at time t2, the potential of the node N5 changes to "L" level. Assume that the potential of the node N4 exceeds the potential Vcc1 at time t3. Subsequently, the potential of the node N3 is saturated and kept at the level of the potential Vcc1 owing to the characteristics of the transistor QNE. Even if the characteristics of the transistor QNE vary, no leakage current flows as long as the transistor QNE is kept at a level at which the p-type diffusion region between the drain of the transistor QP1 and the n-type well are not forward-biased, and hence no problems are posed. The node N4 is connected to one end (an n-type diffusion region in a p-type well) of the NMOS transistor QNE so that even if a 5-V signal having a level higher than the supply potential Vcc1 is input to the node N4 in a signal input operation, no high-level signal is applied to the drain (a p-type impurity region in an n-type well) of the output PMOS transistor QP1 of the output buffer circuit. Therefore, the pn junction between the p-type impurity region and the n-type well is not forward-biased. This facilitates input-/output interfacing with another device.

While a signal input is at "L" level, the above-described problems of forward bias and input leakage current are not posed, and hence a description thereof will be omitted.

As described above, according to the input/output buffer circuit shown in FIG. 6, input/output interfacing can be made with another device which outputs a signal having a voltage level higher than the supply voltage Vcc1 of the integrated circuit incorporating this circuit. In addition, no input leakage current path is present. Therefore, identical integrated circuits can be manufactured regardless of whether input/output interfacing is made with a 3.3-V or 5-V device.

Note that since the NMOS transistor QNE is of an enhancement type, no additional process is required upon addition of the transistor to the circuit. However, since the second supply potential Vcc2, having a level higher than the first supply potential, is applied to the gate of the transistor, in order to maintain its reliability, a change in process, e.g., increasing the thickness of the oxide film of the second NMOS transistor QNE, may be required.

Figure 9:
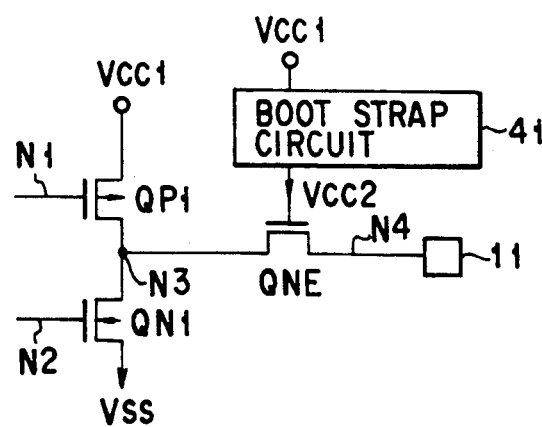
FIG. 9 is a circuit diagram showing an input/output buffer circuit according to the second embodiment of the present invention.

FIG. 9 shows an input/output buffer circuit according to the second embodiment of the present invention. The input/output buffer circuit of the second embodiment is different from that of the first embodiment shown in FIG. 6 in that a bootstrap circuit 41 is arranged to boost a supply potential Vcc1 so as to generate a second supply potential Vcc2 and apply it to the gate of an NMOS transistor QNE of an enhancement type. Since other arrangements are the same, the same reference numerals in FIG. 9 denote the same parts as in FIG. 6.

The operation of the input/output buffer circuit shown in FIG. 9 is basically the same as that of the first embodiment. According to the second embodiment, the second supply potential Vcc2 need not be provided from the outside of the integrated circuit, unlike the first embodiment. However, the second embodiment additionally requires the bootstrap circuit 41. Note that the above-mentioned bootstrap circuit 41 need not perform charging/discharging operations but need only statically output a boot level.

FIG. 10 shows an input/output buffer circuit according to the third embodiment of the present invention. The input/output buffer circuit of the third embodiment is different from that of the first embodiment, shown in FIG. 6, in that an NMOS transistor QND of a depletion type is used in place of the NMOS transistor QNE of an enhancement type, and a supply potential Vcc1 is applied to the gate of the second NMOS transistor QND. Since other arrangements are the same, the same reference numerals in FIG. 10 denote the same parts as in FIG. 6.

Note that if another depletion type NMOS transistor is present in the same integrated circuit, the depletion type NMOS transistor QND may be formed simultaneously with the other transistor. If no other depletion type NMOS transistor is present, one step may be added to perform ion implantation for controlling the threshold value of the depletion type NMOS transistor.

An operation of the input/output buffer circuit shown in FIG. 10 is basically the same as that of the first embodiment shown in FIG. 6. This input/output buffer circuit is advantageous over the first embodiment in that a second supply potential Vcc2 need not be applied from the outside of the integrated circuit.

FIG. 11 shows an input/output buffer circuit according to the fourth embodiment of the present invention. The input/output buffer circuit of the fourth embodiment is different from that one shown in FIG. 10 in that the input node of an input buffer circuit 12 is not connected to an, output node N3 of an output buffer circuit 13, another NMOS transistor QND" of a depletion type is connected between an input/output pad 11 and the input node of the input buffer circuit 12, and a supply potential Vcc1 is applied to the gate of the third NMOS transistor QND". Since other arrangements are the same, reference numerals in FIG. 11 denote the same parts as in FIG. 10. In this case, the driving capacity of the NMOS transistor QND is at least equal to that of each of transistors QP1 and QN1 of the output buffer circuit 13. However, since the NMOS transistor QND" is exclusively used for input operations, its size may be set to be smaller than that of the NMOS transistor QND.

The operation of the input/output buffer circuit in FIG. 11 is basically the same as that of the circuit shown in FIG. 10. This input/output buffer circuit is effective in a case wherein it is difficult to connect the input node of the input buffer circuit 12 to the output node N3 of the output buffer circuit 13, and hence the input node of the input buffer circuit 12 is formed to be separated from the output node N3 of the output buffer circuit 13, owing to, e.g., the pattern layout of the output transistors QP1 and QN1 of the output buffer circuit 13.

FIG. 12 shows a modification of the input/output buffer circuit shown in FIG. 11. This input/output buffer circuit is different from the one shown in FIG. 11 in that enhancement type NMOS transistors QNE and QNE" are used in place of the depletion type NMOS transistors QND and QND", and a potential Vcc2 having a level higher than that of a supply potential Vcc1 is applied to the gate of each of the transistors QNE and QNE through a power supply pad (not shown) or a bootstrap circuit (not shown). Since other arrangements are the same, the same reference numerals in FIG. 12 denote the same parts as in FIG. 11. Substantially the same effect as described above can be obtained by the operation of the input/output buffer circuit in FIG. 12 which is basically the same as that of the circuit in FIG. 11.

Another modification of the input/output buffer circuit in FIG. 11 may be formed in such a manner that an enhancement type NMOS transistor QNE is used in place of the depletion type NMOS transistor QND or QND", and a potential Vcc2 having a level higher than that of the supply potential Vcc1 is applied to the gate of the NMOS transistor QNE. FIG. 13 shows a case wherein the enhancement type NMOS transistor QNE is used in place of the NMOS transistor QND". Similar to the above modification, substantially the same effect as described above can be obtained by an operation basically the same as that of the circuit shown in FIG. 11.

Figure 14:
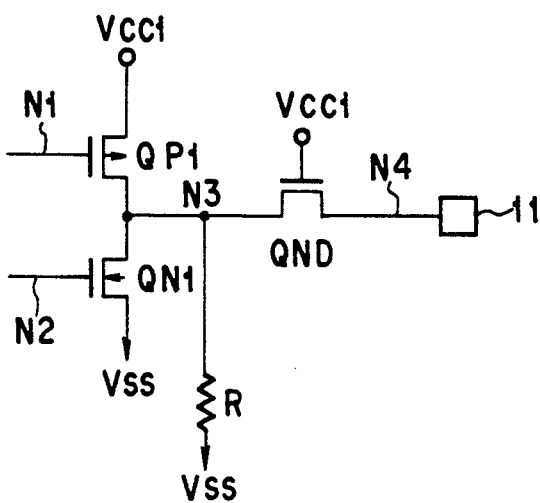
FIG. 14 is a circuit diagram showing part of an input-/output buffer circuit according to a modification of each embodiment.
Figure 15A:
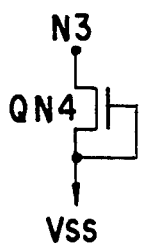
FIGS. 15A and 15B are circuit diagrams, each showing a high-resistance element in FIG. 14 in detail.
Figure 15B:
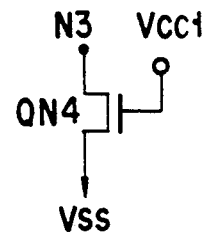

In the input/output buffer circuit of each embodiment, if an input signal is kept at 5 V for a long period of time, the potential of the output node N3 of the output buffer circuit 13 may exceed the supply potential Vcc1 due to a leakage current in the NMOS transistor QNE or QND. In order to prevent this, a high-resistance element R may be inserted between the output node N3 of the output buffer circuit 13 and the potential Vss node in, e.g., the circuit shown in FIG. 10, as shown in FIG. 14. In practice, as the high-resistance element R, one of the following elements may be used in accordance with the present invention: a polysilicon element having a high resistance; an enhancement type NMOS transistor QN4 having a gate and a source connected to each other, as shown in FIG. 15A; and a small-channel width enhancement type NMOS transistor QN4 having a gate to which a supply potential Vcc1 is applied, as shown in FIG. 15B.

Figure 16:
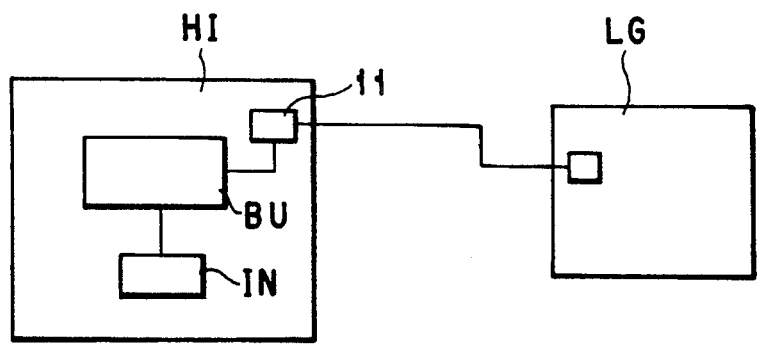
FIG. 16 is a block diagram showing a state of connection between the semiconductor integrated circuit of the present invention and a peripheral logic circuit.

FIG. 16 is a block diagram showing a circuit arrangement in which an input buffer circuit BU of the present invention, arranged in a semiconductor integrated circuit HI, is connected to another device, e.g., a peripheral logic circuit LG, through an input/output pad 11. Note that reference symbol IN denotes an internal circuit arranged in the semiconductor integrated circuit HI.

As has been described above, the input/output buffer circuit of the present invention can be included in a system in which even if the supply voltage of the integrated circuit is set to be 3.3 V, input/output interfacing can be directly made with another logic device or memory device which is operated at a voltage of a higher level, e.g., 5 V, the TTL level is ensured as an output level, and no input leakage current is present in an input operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An input/output buffer circuit for a semiconductor integrated circuit, comprising:
   an input/output pad located in the semiconductor integrated circuit;
   an input buffer circuit for receiving a first signal through said input/output pad;
   an output buffer circuit composed of a first MOS field-effect transistor and a second MOS field-effective transistor of first and second conductivity types, respectively, connected in series between first and second supply potential terminals, said output buffer circuit outputting a second signal to an output node between said first and second MOS field-effect transistors in accordance with a third signal supplied from an internal circuit located in the semiconductor integrated circuit; and
   a third MOS field-effect transistor of the second conductivity type having a lower threshold voltage than that of said first and second MOS field effective transistors and having a first current path connected to said output node, a second current path connected to said input/output pad, and a gate supplied with a potential equal to that of said first potential supply terminal,
   wherein an input node of said input buffer circuit is connected to the output node of said output buffer circuit.

2. An input/output buffer circuit for a semiconductor integrated circuit, comprising:
   an input/output pad located in the semiconductor integrated circuit;
   an input buffer circuit for receiving a first signal from the outside of the semiconductor integrated circuit through said input/output pad;
   an output buffer circuit comprising first and second MOS field-effect transistors, respectively, of a first and a second conductivity type connected in series between a first supply potential terminal and a second supply potential terminal, said output buffer circuit outputting a second signal to an output node between said first MOS field-effect transistor and said second MOS field-effect transistor in accordance with a second signal from an internal circuit located in the semiconductor integrated circuit; and
   a third MOS field-effect transistor of the second conductivity type connected between an output node of said output buffer circuit and said input/output pad, and having a gate supplied with a potential higher than that of said first supply potential terminal,
   wherein an input node of said input buffer circuit is connected to the output node of said output buffer circuit.

3. The input/output buffer circuit according to claim 2, further comprising a bootstrap circuit for boosting an externally provided supply potential to generate a potential having a level higher than that of the first supply terminal, and for applying the externally provided supply potential to the gate of said third MOS field-effect transistor or to a fourth MOS field-effect transistor of the second conductivity type.

4. An input/output buffer circuit for a semiconductor integrated circuit, comprising:
   an input/output pad located in the semiconductor integrated circuit;
   an input buffer circuit for receiving a first signal from the outside of the semiconductor integrated circuit through said input/output pad;
   an output buffer circuit having a first MOS field-effect transistor of a first conductivity type and a second MOS field-effect transistor of a second conductivity type, the first and second MOS field effect transistors connected in series between a first supply potential terminal and a second supply potential terminal, said output buffer circuit outputting a second signal to an output node between said first MOS field-effect transistor and said second MOS field-effect transistor in accordance with a signal from an internal circuit located in the semiconductor integrated circuit;
   a third MOS field-effect transistor of the second conductivity type connected between the output node of said output buffer circuit and said input/output pad; and
   a fourth MOS field-effect transistor of the second conductivity type connected between said input/output pad and an input node of said input buffer circuit,
   wherein said third and fourth MOS field-effect transistors are MOS field-effect transistors which have a threshold voltage which is lower than a threshold voltage of said first MOS field-effect transistor and to which a potential is applied having the same level as that applied to the first supply potential terminal.

5. The input/output buffer circuit according to claim 4, wherein said fourth MOS field-effect transistor is smaller in size than said third MOS field-effect transistor.

6. An input/output buffer circuit for a semiconductor integrated circuit, comprising:
   an input/output pad located in the semiconductor integrated circuit;
   an input buffer circuit for receiving a first signal from the outside of the semiconductor integrated circuit through said input/output pad;
   an output buffer circuit having a first MOS field-effect transistor of a first conductivity type and a second MOS field-effect transistor of a second conductivity type the first and second MOS field effect transistors connected in series between a first supply potential terminal and a second supply potential terminal, said output buffer circuit outputting a second signal to an output node between said first MOS field-effect transistor and said second MOS field-effect transistor in accordance with a third signal from an internal circuit located in the semiconductor integrated circuit;
   a third MOS field-effect transistor of the second conductivity type connected between the output node of said output buffer circuit and said input/output pad; and
   a fourth MOS field-effect transistor of the second conductivity type connected between said input/output pad and an input node of said input buffer circuit, wherein said third and fourth MOS field-effect transistors have gates to which a potential is applied having a level higher than that of the first supply potential terminal.

7. The input/output buffer circuit according to claim 6, wherein said fourth MOS field-effect transistor is smaller in size than said third MOS field-effect transistor.

8. The input/output buffer circuit according to claim 6, further comprising a bootstrap circuit for boosting an externally provided supply potential to generate a potential having a level higher than that of the first supply potential terminal, and for applying the potential to the gate of said third MOS field-effect transistor or to the gate of said fourth MOS field-effect transistor.

9. An input/output buffer circuit for a semiconductor integrated circuit, comprising:
   an input/output pad located in the semiconductor integrated circuit;
   an input buffer circuit for receiving a first signal from the outside of the semiconductor integrated circuit through said input/output pad;
   an output buffer circuit having a first MOS field-effect transistor of a first conductivity type and a second MOS field-effect transistor of a second conductivity type the first and second MOS field-effect transistors connected in series between a first supply potential terminal and a second supply potential terminal, said output buffer circuit outputting a second signal to an output node between said first MOS field-effect transistor and said second MOS field-effect transistor in accordance with a third signal from an internal circuit located in the semiconductor integrated circuit;
   a third MOS field-effect transistor of the second conductivity type connected between the output node of said output buffer circuit and said input/output pad; and
   a fourth MOS field-effect transistor of the second conductivity type connected between said input/output pad and an input node of said input buffer circuit,
   wherein one of said third and fourth MOS field-effect transistors has a threshold voltage lower than a threshold voltage of the first MOS field-effect transistor and to which a potential is applied having the same value as that applied to the first supply potential terminal, and the other of said third and fourth MOS field-effect transistors has a gate to which a potential is applied having a level higher than that of the first supply potential terminal.

10. The input/output buffer circuit according to claim 9, wherein a channel width of said fourth MOS field-effect transistor is smaller than a channel width of said third MOS field-effect transistor.

11. The input/output buffer circuit according to claim 9, further comprising a bootstrap circuit for boosting an externally provided supply potential to generate a potential having a level higher than that of the first supply potential terminal, and for applying the potential to the gate of said third MOS field-effect transistor or to the gate of said fourth MOS field-effect transistor.

12. The input/output buffer circuit according to claim 1, further comprising a high-resistance element connected between the output node of said output buffer circuit and said second supply potential terminal.

13. The input/output buffer circuit according to claim 2, further comprising a high-resistance element connected between the output node of said output buffer circuit and said second supply potential terminal.

14. The input/output buffer circuit according to claim 4, further comprising a high-resistance element connected between the output node of said output buffer circuit and said second supply potential terminal.

15. The input/output buffer circuit according to claim 6, further comprising a high-resistance element connected between the output node of said output buffer circuit and said second supply potential terminal.

16. The input/output buffer circuit according to claim 9, further comprising a high-resistance element connected between the output node of said output buffer circuit and said second supply potential terminal.

17. The input/output buffer circuit according to claim 12, wherein said high-resistance element comprises a fifth MOS field-effect transistor of the second conductivity type.

18. The input/output buffer circuit according to claim 13, wherein said high-resistance element comprises a fifth MOS field-effect transistor of the second conductivity type.

19. The input/output buffer circuit according to claim 14, wherein said high-resistance element comprises a fifth MOS field-effect transistor of the second conductivity type.

20. The input/output buffer circuit according to claim 15, wherein said high-resistance element comprises a fifth MOS field-effect transistor of the second conductivity type.

21. The input/output buffer circuit according to claim 16, wherein said high-resistance element comprises a fifth MOS field-effect transistor of the second conductivity type.

22. The input/output buffer circuit according to claim 16, wherein said high-resistance element comprises a fifth MOS field-effect transistor of the second conductivity type.

* * * * *